United States Patent
Li et al.

(10) Patent No.: US 9,679,747 B2
(45) Date of Patent: Jun. 13, 2017

(54) DYNAMIC PATTERN GENERATOR AND METHOD OF TOGGLING MIRROR CELLS OF THE DYNAMIC PATTERN GENERATOR

(71) Applicant: TAIWAN SEMICONDUCTOR MANUFACTURING COMPANY LTD., Hsinchu (TW)

(72) Inventors: Shao-Yu Li, Hsinchu (TW); Tsung-Hsin Yu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 159 days.

(21) Appl. No.: 14/614,756

(22) Filed: Feb. 5, 2015

(65) Prior Publication Data
US 2016/0148784 A1 May 26, 2016

Related U.S. Application Data (60) Provisional application No. 62/084,895, filed on Nov. 26, 2014.

(51) Int. Cl.
*H01J 37/04* (2006.01)
*H01J 37/317* (2006.01)

(52) U.S. Cl.
CPC ........ *H01J 37/3177* (2013.01); *H01J 37/045* (2013.01); *H01J 2237/0432* (2013.01); *H01J 2237/31789* (2013.01)

(58) Field of Classification Search
CPC ............... G03F 7/2051; G03F 7/70508; G03F 7/70525; H01J 2237/31789
See application file for complete search history.

(56) References Cited

U.S. PATENT DOCUMENTS

| | | | |
|---|---|---|---|
| 8,941,085 B2* | 1/2015 | Kuo .................... | H01J 37/3175 250/396 R |
| 8,975,601 B1* | 3/2015 | Chen .................... | H01J 37/3175 250/397 |
| 9,293,294 B1* | 3/2016 | Li ........................ | H01J 37/3177 |
| 2009/0046264 A1* | 2/2009 | Pouls .................. | G03F 7/70508 355/53 |
| 2014/0272712 A1* | 9/2014 | Tseng .................... | H01J 37/147 250/396 R |
| 2015/0160568 A1* | 6/2015 | Yu ........................ | G03F 7/70491 355/67 |

* cited by examiner

*Primary Examiner* — Brooke Purinton
(74) *Attorney, Agent, or Firm* — WPAT, P.C., Intellectual Property Attorneys; Anthony King (57) ABSTRACT

The present disclosure provides a method for operating a dynamic pattern generator (DPG) having a mirror array. The method comprises receiving a clock signal, determining a time delay based on the period of the clock signal, determining a first clock signal for toggling a first group of mirror cells in the mirror array, determining a second clock signal, lagging behind the first clock signal by the time delay, for toggling a second group of mirror cells in the mirror array, toggling the first group of mirror cells in the mirror array in response to the first clock signal, and toggling the second group of the mirror cells in the mirror array in response to the second clock signal.

20 Claims, 9 Drawing Sheets

DYNAMIC PATTERN GENERATOR AND METHOD OF TOGGLING MIRROR CELLS OF THE DYNAMIC PATTERN GENERATOR

RELATED APPLICATION

This application claims priority to U.S. Provisional Application No. 62/084,895, filed on Nov. 26, 2014 and entitled "DYNAMIC PATTERN GENERATOR AND METHOD OF TOGGLING MIRROR CELLS OF THE DYNAMIC PATTERN GENERATOR." The application is incorporated herein by reference.

BACKGROUND

In reflective electron beam lithography, a dynamic pattern generator (DPG) is utilized to deliver exposure patterns. The DPG includes an array of mirror cells. In a process for patterning a wafer, some mirror cells in the array may absorb electrons, while the other mirror cells may reflect electrons back to the wafer. As the wafer size continues to increase, the dimension of the mirror array increases as well. DPGs are required to operate at a relatively high data rate and toggling rate. In patterning a wafer, however, if all mirror cells are toggled at the same time, a transient spike current may incur a significant dynamic IR drop, which may deteriorate the patterning performance.

BRIEF DESCRIPTION OF THE DRAWINGS

Aspects of the present disclosure are best understood from the following detailed description when read with the accompanying FIG. 1t is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Figure 1:
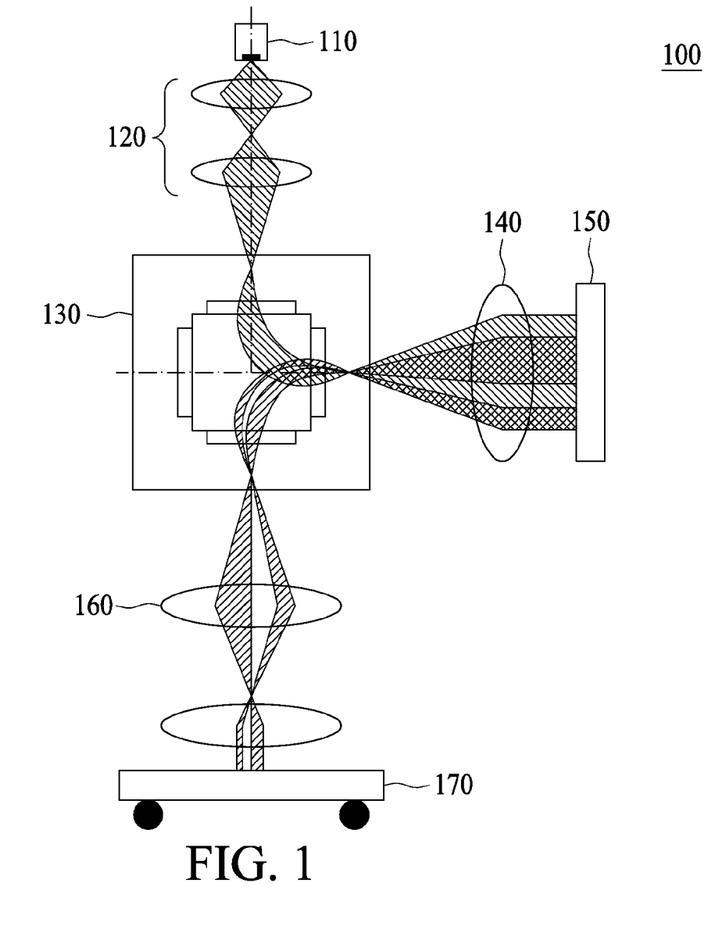
FIG. 1 is a schematic diagram of a reflection electron beam lithography system, in accordance with some embodiments.

FIG. 1 is a schematic diagram of a reflection electron beam lithography system 100, in accordance with some embodiments. Referring to FIG. 1, system 100 includes an electron source 110, illumination electron-optics 120, a magnetic prism 130, an objective electron lens 140, a dynamic pattern generator (DPG) 150 and projection electron-optics 160.

The electron source 110 emits an electron beam toward the illumination electron-optics 120. The illumination electron-optics 120 collimates the electron beam emitted by electron source 110 and determines the current setting of the electron beam for illuminating the DPG 150. The magnetic prism 130 applies a force upon incident electrons of the electron beam to direct the electron beam towards the objective electron lens 140 and the DPG 150. The objective optics 140 decelerates and focuses the incident electrons of the electron beam.

The DPG 150 absorbs or reflects the electrons of the electron beam based on patterning data for exposure. The DPG 150 includes an array of mirror cells (pixels). Each cell in the DPG 150 includes a register for receiving the patterning data, and a metal pad coupled to a voltage output controlled by the register. A mirror cell reflects electrons in the electron beam or absorbs the electrons, dependent on a voltage applied to the metal pad of the mirror cell.

Electrons reflected from the DPG 150 are then reaccelerated by the magnetic prism 130. The magnetic prism 130 directs the reflected electrons towards the projection electron-optics 160. The projection electron-optics 160 focuses and demagnifies the incoming electron beam onto a photoresist on a wafer held on a wafer stage 170.

Moreover, the DPG 150 receives the patterning data and exposes the lithographic pattern through the mirror array. The incident electrons are either reflected backward from or absorbed by the corresponding mirror cells according to the controlled voltages applied to the cells. Therefore, each of the mirror cells acts like an "on-off" switch to represent a binary value of a corresponding pixel in the patterning data.

The DPG 150 is required to operate at a relatively high data rate, for example, several trillion bits per second, in order to support advanced reflective electron beam lithography systems. Accordingly, the mirror array may include more than one million mirror cells. Each time the exposure pattern is updated, patterning data are sent to the registers of mirror cells in advance to facilitate mirror cells to perform data change at register outputs. The DPG 150 can then handle exposing periods and update rates of patterning in response to a clock signal. When a cell experiences change of binary patterning data from an on state to an "off" state or vice versa (i.e., togging operation), a temporary current flowing among circuit nodes is observed. The transient current along with circuit resistance leads to a temporary voltage drop. It should be noted that when a considerable number of mirror cells are toggled at the same time, the transient current may incur an effect called "dynamic IR (voltage) drop." The dynamic IR drop may cause mirror cells to operate below normal working voltages and thus deteriorate cell function.

Dynamic IR drop results from current fluctuation during a transient state of toggling before the togging reaches a steady state. The reduced voltage due to dynamic IR drop is attributed to the presence of toggling and is thus not stable. To alleviate the dynamic IR drop, it is not effective to compensate for the reduced voltage by adding a constant voltage level. In some existing approaches, decoupling capacitors are disposed in the vicinity of mirror cells to provide a compensation current during a transient period of a toggling operation. However, the area consumption and position limitation of decoupling capacitors make it difficult to incorporate additional capacitors into a dense circuitry like DPG.

Figure 2:
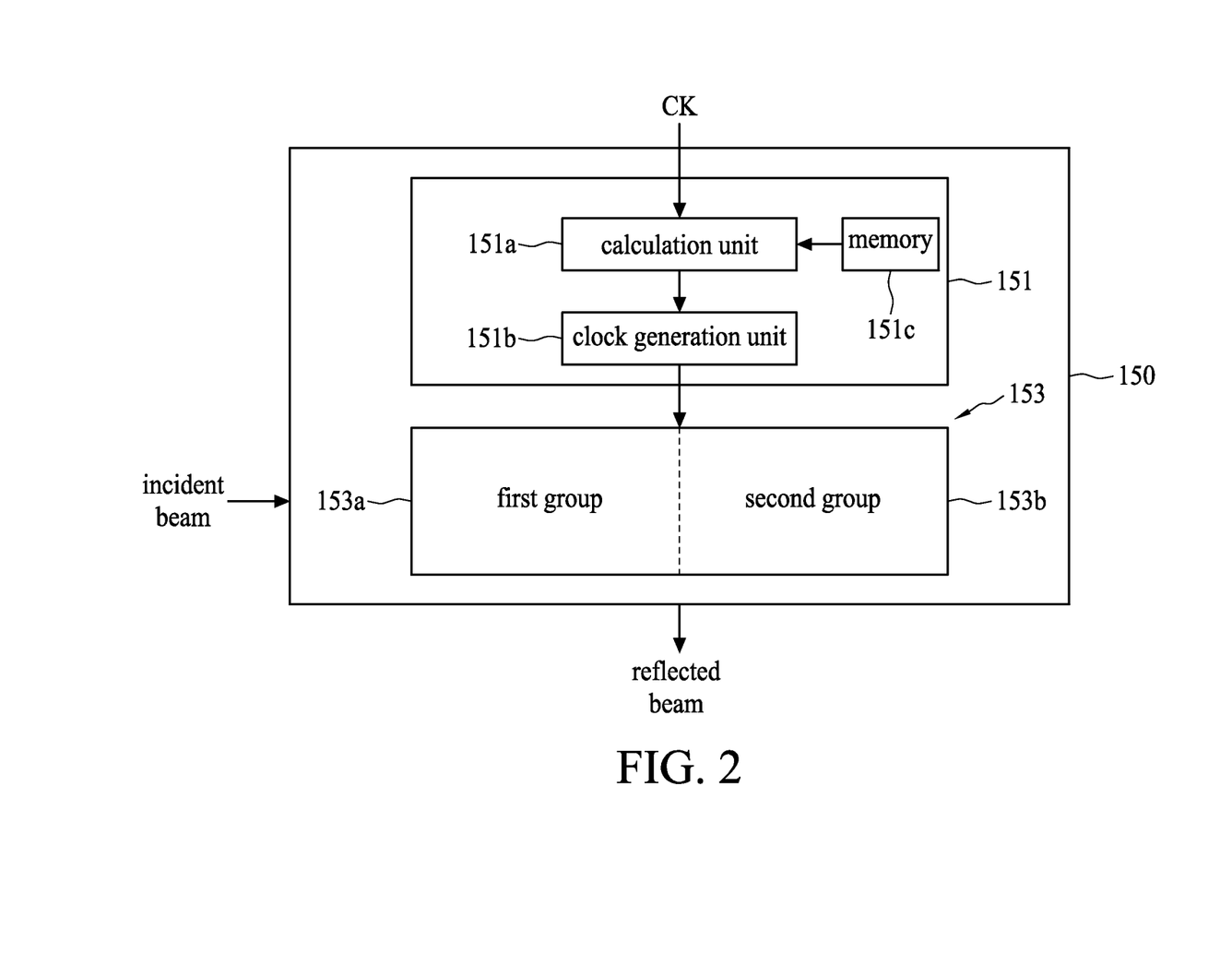
FIG. 2 is a block diagram of a dynamic pattern generator (DPG), in accordance with some embodiments.

FIG. 2 is a block diagram of the DPG 150, in accordance with some embodiments. Referring to FIG. 2, the DPG 150 includes a controller 151 and a mirror array 153. The mirror array 153 includes an array of mirror cells. By toggling the mirror cells between "on" and "off" states, a wafer is patterned in a patterning process. The controller 151 is configured to determine the number of groups of the mirror cells to be toggled and determine a time delay from one clock signal to another so as to provide clock signals at different time points to toggle the mirror array 153 by groups at the different time points. Although only two groups of mirror cells are illustrated in FIG. 2, other number of groups falls within the contemplated scope of various embodiments.

The controller 151 includes a calculation unit 151a, a clock generation unit 151b and a memory 151c. The calculation unit 151a is configured to determine the number of groups of the mirror cells in the mirror array 153 to be toggled. In some embodiments, since toggling the mirror array 153 by groups alleviates dynamic IR drop, the number of groups of mirror cells to be toggled is predetermined.

In other embodiments, however, the number of groups of mirror cells to be toggled is determined based on patterning data. In an embodiment, patterning data for patterning a wafer has been received and is stored in the memory 151c. The patterning data include information on the number of mirror cells in the mirror array 153 that need to be toggled in a toggling operation. Based on the patterning data, it is determined that a large number of groups of mirror cells are required as the number of mirror cells to be toggled is relatively large, while a small number of groups of mirror cells are required as the number of mirror cells to be toggled is relatively small.

The calculation unit 151a is also configured to determine a time delay based on the period of a clock signal CK. In some embodiments, a regular interval exists from one toggling clock signal to another. As a result, each toggling operation for one of the groups is triggered at a regular interval. For example, a first group of mirror cells is toggled in response to a first clock signal at a time point T1. In an embodiment, the first clock signal is in phase with the clock signal CK. Next, a second group of the mirror cells is toggled in response to a second clock signal at a time point T2, later than the time point T1 by a time delay. In other embodiments, however, the time delay from one clock signal to another is different, as long as these toggling clock signals are provided within the period of the clock signal CK.

The clock generation unit 151b is configured to generate toggling clock signals at time points in response to the information on time delay from the calculation unit 151a. In the present embodiment, the clock generation unit 151b provides a first clock signal in phase with the clock signal CK to the first group of mirror cells 153a, and provides a second clock signal lagging behind the first clock signal by the time delay to the second group of mirror cells 153b. The first group of mirror cells 153a is toggled in response to the first clock signal. The second group of mirror cells 153b is toggled in response to the second clock signal. The first group 153a and the second group 153b may have a same size in some embodiments but are not limited thereto. Effectively, by toggling the first group 153a and second group 153b at different time points, dynamic IR drop is reduced. Moreover, an incident beam on the DPG 150 is patterned, resulting in a reflected beam that transfers the patterning data into a desired pattern on the wafer.

Figure 3:
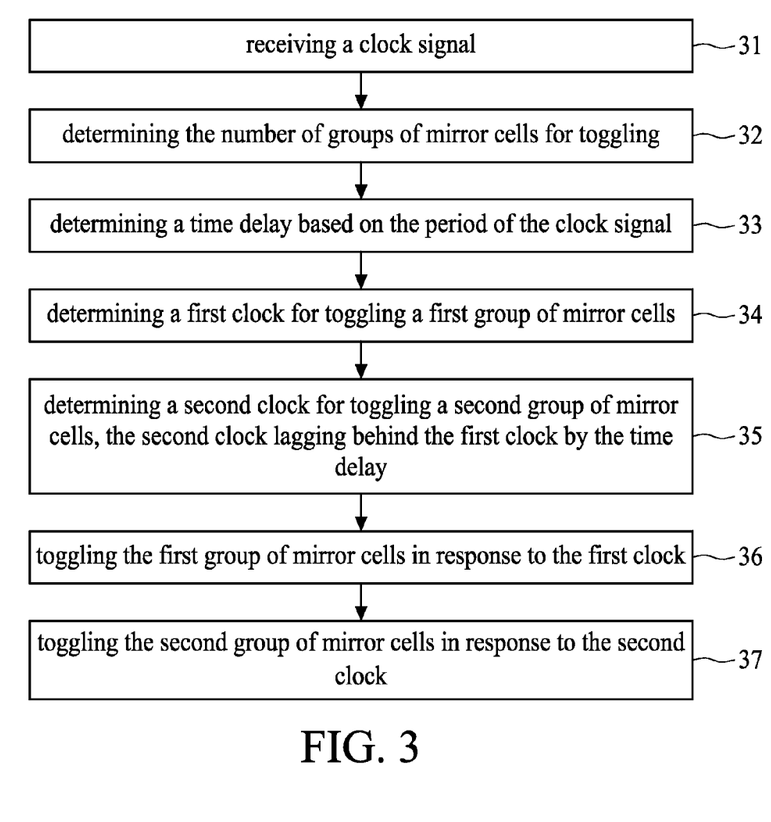
FIG. 3 is a flow diagram of a method for operating a DPG, in accordance with some embodiments.

FIG. 3 is a flow diagram of a method for operating a DPG, in accordance with some embodiments. Referring to FIG. 3, in operation 31, a clock signal CK is received. Moreover, also referring to FIG. 2, patterning data for patterning a wafer has been received and is stored in the memory 151c. The patterning data include information on the number of mirror cells in the mirror array 153 that need to be toggled in a toggling operation. As previously discussed, if a large number of mirror cells or the entire array of mirror cells is toggled, a severe case of dynamic IR drop may occur and thus may deteriorate the patterning performance.

In some embodiments, to alleviate the issue of dynamic IR drop, the mirror cells in the mirror array 153 are toggled by groups in response to different toggling clock signals within one period of the clock signal CK. In operation 32, the number of groups of mirror cells to be toggled in the toggling operation is determined. In an embodiment, the number of groups is determined based on the patterning data stored in the memory 151c. For example, if the number of mirror cells to be toggled is relatively small, the number of groups is determined to be small. If, on the other hand, the number of mirror cells to be toggled is relatively large, then the number of groups is determined to be large.

In operation 33, a time delay based on the period of the clock signal CK is determined. For example, given "N" groups as determined to be toggled, then N clock signals are provided to toggle the N groups, N being a natural number. In some embodiments, a same time delay exists from one toggling clock signal to another. In other embodiments, the time delay from one toggling clock signal to another is different, as long as these toggling clock signals are provided within the period of the clock signal CK in a toggling operation.

After a time delay is determined in operation 33, in operation 34, a first clock signal for toggling a first group of mirror cells in the mirror array is determined. In an embodiment, the first clock signal is substantially in phase with the clock signal CK.

In operation 35, a second clock signal lagging behind the first clock signal by the time delay is determined.

Subsequently, a first group of the mirror cells is toggled in response to the first clock signal in operation 36. Then a second group of the mirror cells is toggled in response to the second clock signal in operation 37. In an embodiment, a group of mirror cells is toggled at a rising edge of a clock signal. In some embodiments, as the exemplary case illustrated in FIG. 2, each group of mirror cells has a same size. In other embodiments, however, one group of mirror cells has a different size from the others.

Figure 4:
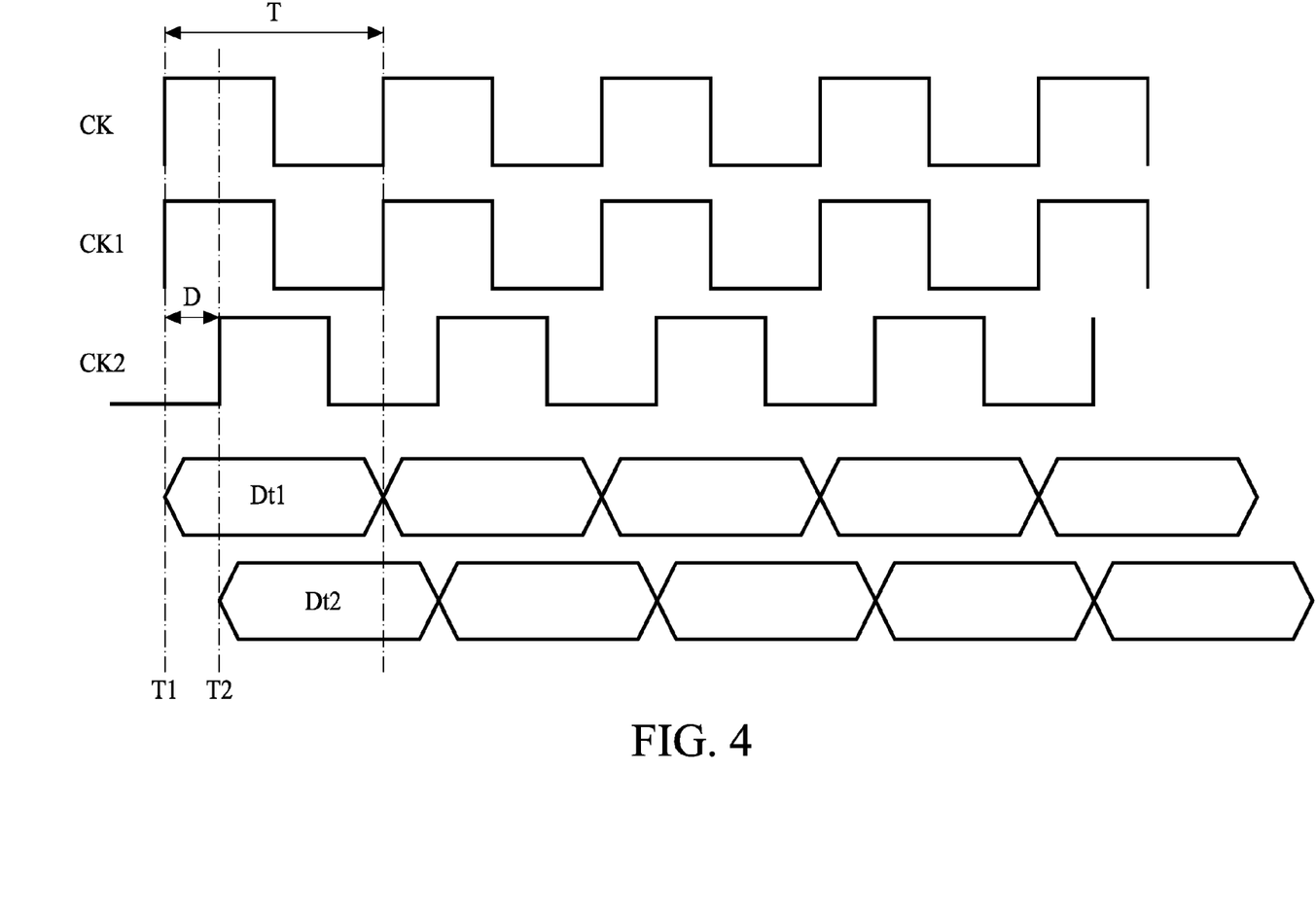
FIG. 4 is a timing diagram of clock signals for toggling a mirror array, in accordance with some embodiments.

FIG. 4 is a timing diagram of clock signals for toggling a mirror array, in accordance with some embodiments. Referring to FIG. 4 and also to FIG. 2, the clock signal CK received at the calculation unit 151a has a period of T. A first clock signal CK1 is provided from the clock generation unit 151b for toggling the first group of mirror cells 153a. The first clock signal CK1 is substantially in phase with the clock signal CK. In response to a rising edge of the first clock signal CK1 at a time point T1, first patterning data Dt1 are provided to toggle the first group of mirror cells 153a. Moreover, a second clock signal CK2 is provided from the clock generation unit 151b for toggling the second group of mirror cells 153b. The second clock signal CK2 lags behind the first clock signal CK1 by a time delay D. In response to a rising edge of the second clock signal CK2 at a time point T2, second patterning data Dt2 are provided to toggle the second group of mirror cells 153a. In an embodiment, the first patterning data D0 and the second patterning data Dt2 are stored in the memory 151c. In some embodiments, the period T and the time delay D are approximately 20 nanoseconds (ns) and 5 ns, respectively.

Figure 5A:
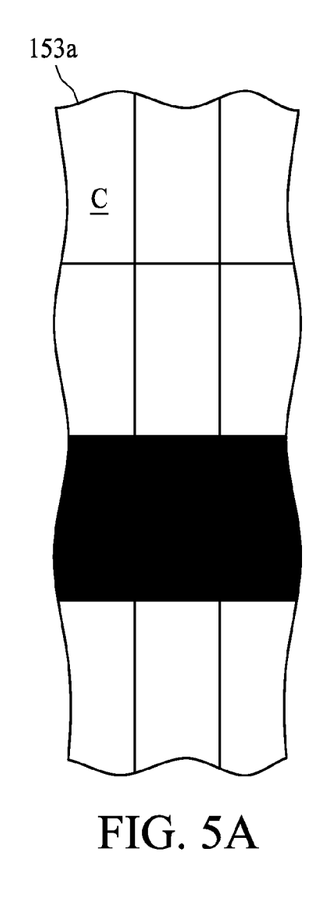
FIGS. 5A and 5B are diagrams showing mirror cells during a toggling operation.
Figure 5B:
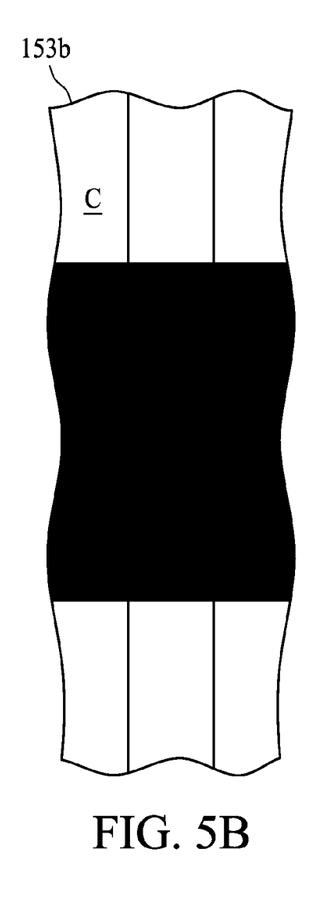

FIGS. 5A and 5B are diagrams showing mirror cells C during a toggling operation. Referring to FIG. 5A and also to FIG. 2, in the first group 153a, in accordance with the first patterning data Dt1, some mirror cells (represented by dark regions) absorb the incident beam, while the others (represented by white regions) reflect the incident beam. Referring to FIG. 5B and also to FIG. 2, in the second group 153b, similarly, in accordance with the second patterning data Dt2, some mirror cells (represented by dark regions) absorb the incident beam, while the others (represented by white regions) reflect the incident beam. As the first patterning data D0 and the second patterning data Dt2 may be different from each other, the dark and white regions in the first group of mirror cells 153a and the second group of mirror cells 153b are different.

Figure 6A:
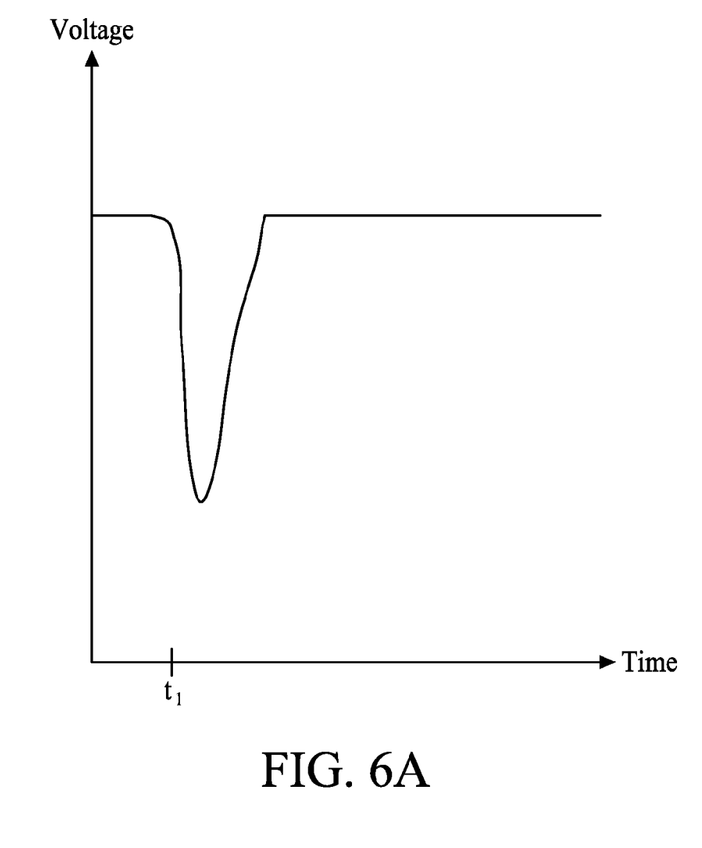
FIGS. 6A and 6B are diagrams showing dynamic voltage drops after an array-based toggling and a group-based toggling, respectively.
Figure 6B:
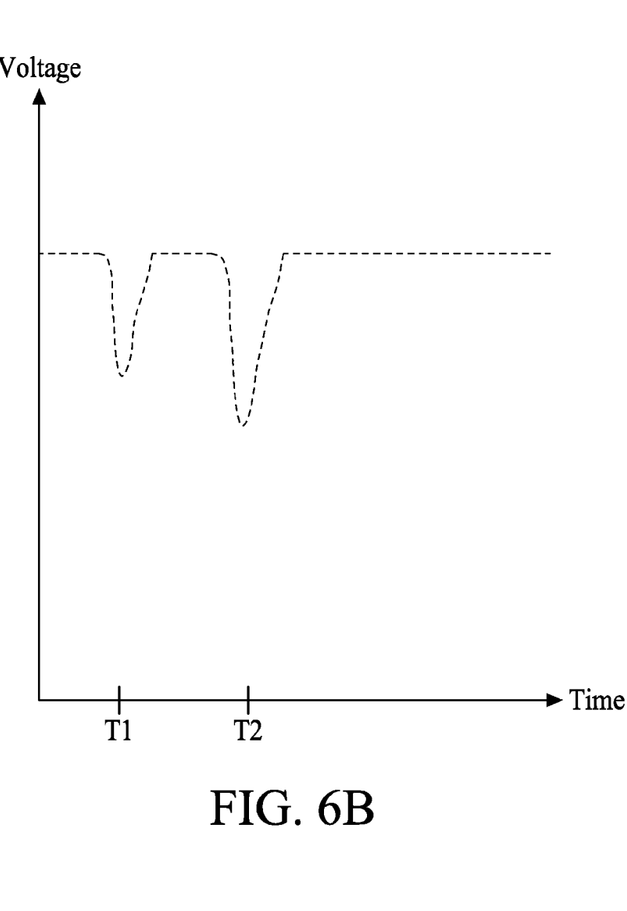

FIGS. 6A and 6B are diagrams showing dynamic voltage drops after an array-based toggling and a group-based toggling, respectively. Referring to FIG. 6A, when all the mirror cells in a mirror array are toggled at a same time point t1, as in some existing approaches, a relatively large current spike may appear, which causes a severe case of dynamic IR drop.

On the other hand, referring to FIG. 6B, by toggling mirror cells by groups at different time points T1 and T2 according to the embodiments in the present disclosure, no large current spikes are observed and the issue of dynamic IR drop is alleviated.

Figure 7:
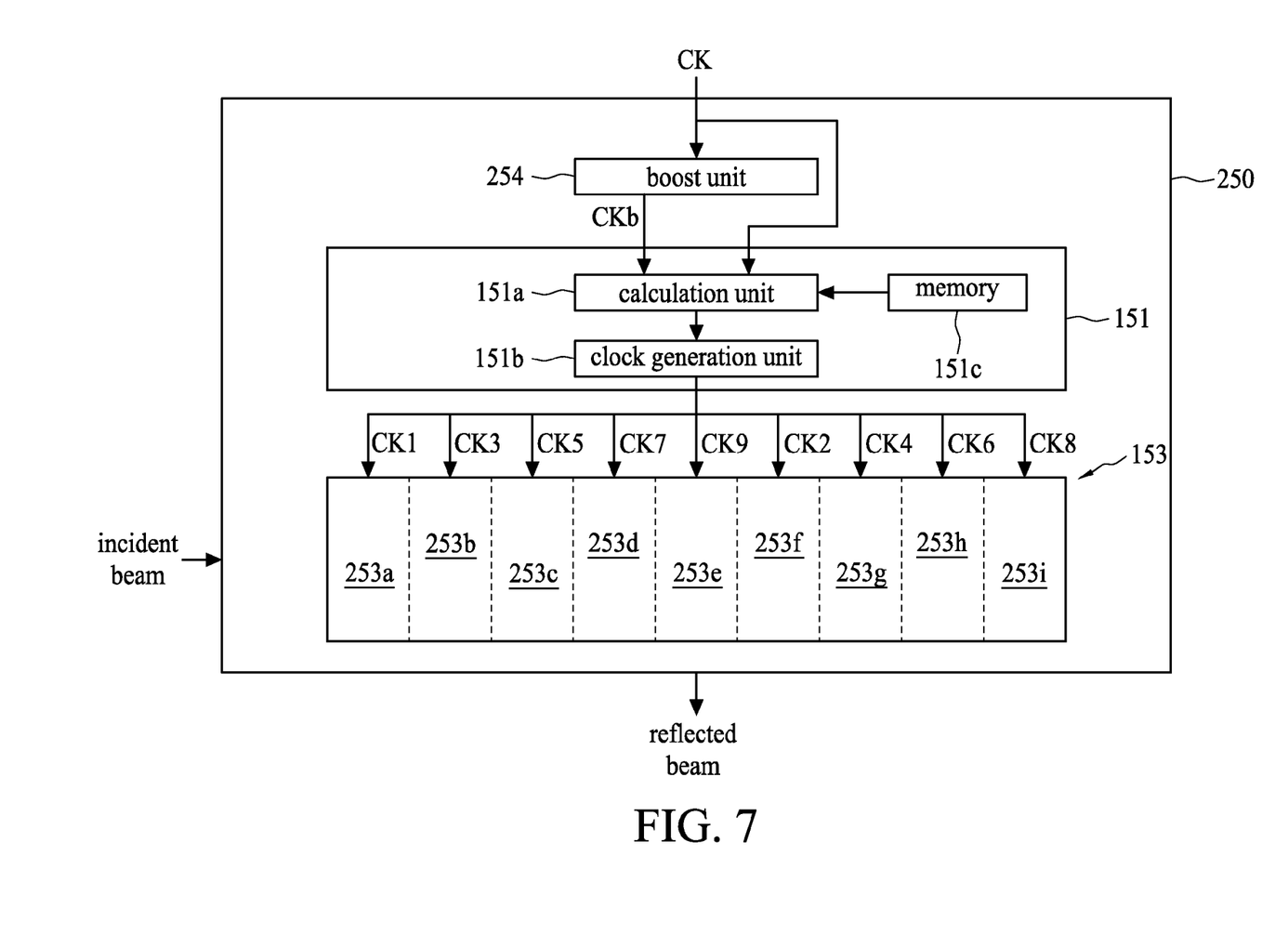
FIG. 7 is a block diagram of a DPG according to some embodiments of the present disclosure.

FIG. 7 is a block diagram of a DPG 250 according to some embodiments of the present disclosure. Referring to FIG. 7, the DPG 250 is similar to the DPG 150 described and illustrated with reference to FIG. 2 except that, for example, the DPG 250 further includes a boost unit 254. Moreover, based on the patterning data stored in memory 151c or a predetermined group partitioning, the calculation unit 151a determines that the mirror array 153 is toggled in, for example, 9 groups of mirror cells 253a-253i. As a result, 9 toggling clock signals are required to trigger toggling in their respective groups of mirror cells. Although only 9 groups of mirror cells are illustrated in FIG. 2, other number of groups falls within the contemplated scope of various embodiments.

The boost unit 254 is configured to provide an output clock signal CKb whose frequency is a multiple of the frequency of the input clock signal CK to facilitate spreading toggling clock signals during the period T of the clock signal CK. In an embodiment, the frequency of the clock signal CK is approximately 50 megahertz (MHz), and the frequency of the output clock signal CKb is approximately 450 MHz, 9 times the frequency of the clock signal CK.

In the present embodiment, the clock generation unit 151b provides 9 toggling clock signals CK1-CK9 to their respective groups 253a-253i (9 groups) at different time points within the period T of the clock signal CK. The clock signals CK1-CK9 can be provided one at a time to the mirror array 153 from the leftmost group 253a to the rightmost group 253i, or vice versa. Nevertheless, to reduce dynamic IR drop, in an embodiment according to the present disclosure, the clock signals CK1-CK9 are provided to the mirror array 153 in a balanced manner. For example, if a toggling clock signal is provided to one of the groups in one half of the mirror array 153, then the next toggling clock signal is provided to one of the groups in the other half of the mirror array 153.

Accordingly, as illustrated in FIG. 7, the first clock signal CK1 is provided to the first group 253a in the left half of the mirror array 153, and then the second clock signal CK2 is provided to the sixth group 253f in the right half of the mirror array 153.

Likewise, after the second clock signal CK2 is sent, the third clock signal CK3 is provided to the second group 253b in the left half of the mirror array 153, and subsequently the fourth clock signal CK4 is provided to the seventh group 253g in the right half of the mirror array 153.

Moreover, after the fourth clock signal CK4 is sent, the fifth clock signal CK5 is provided to the third group 253c in the left half of the mirror array 153, and then the sixth clock signal CK6 is provided to the eighth group 253h in the right half of the mirror array 153.

Furthermore, after the sixth clock signal CK6 is sent, the seventh clock signal CK7 is provided to the fourth group 253d in the left half of the mirror array 153, and then the eighth clock signal CK8 is provided to the ninth group 253i in the right half of the mirror array 153. Next, a ninth clock signal CK9 is provided to the fifth group 253e.

Figure 8:
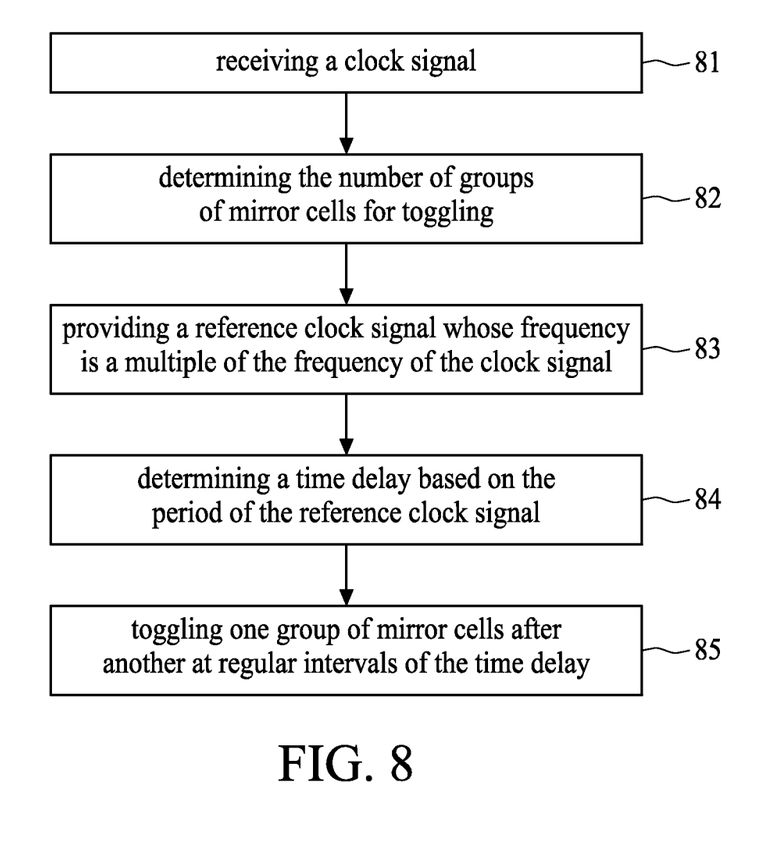
FIG. 8 is a flow diagram of a method for operating a DPG, in accordance with some embodiments.

FIG. 8 is a flow diagram of a method for operating the DPG 250 illustrated in FIG. 7, in accordance with some embodiments. Referring to FIG. 8, in operation 81, a clock signal CK is received. Next, in operation 82, the number of groups of mirror cells to be toggled in a toggling operation is determined. In an embodiment, the number of groups is determined based on the patterning data stored in memory 151c. In another embodiment, the number of group is a predetermined value.

In operation 83, a reference clock signal CKb whose frequency is a multiple of the frequency of the clock signal CK is provided. The reference clock signal CKb facilitates spreading toggling clock signals in one period T of the clock signal CK, in particular in the case of, for example, a relatively large number of groups is determined.

In operation 84, a time delay is determined based on the period of the reference clock signal CKb. In an embodiment, a toggling clock signal for toggling a group of mirror cells is provided at a rising edge of the reference clock signal CKb. As a result, the time delay is substantially equal to the period of the reference clock signal CKb.

Subsequently, in operation 85, the mirror cells in the mirror array 153 are toggled one group after another at regular intervals of the time delay. In some embodiments, the first clock signal CK1 is in phase with the clock signal CK. The second clock signal CK2 lags behind the first clock signal CK1 by the time delay. The third clock signal CK3 lags behind the second clock signal CK2 by the time delay, and so forth.

Moreover, the mirror cells in the mirror array 153 are toggled by groups in a balanced manner. In some embodiments, an N-th clock signal is provided to one of the groups in one half of the mirror array 153, and an (N+1)-th clock signal is then provided to the other half of the mirror array 153, N being a natural number.

Figure 9:
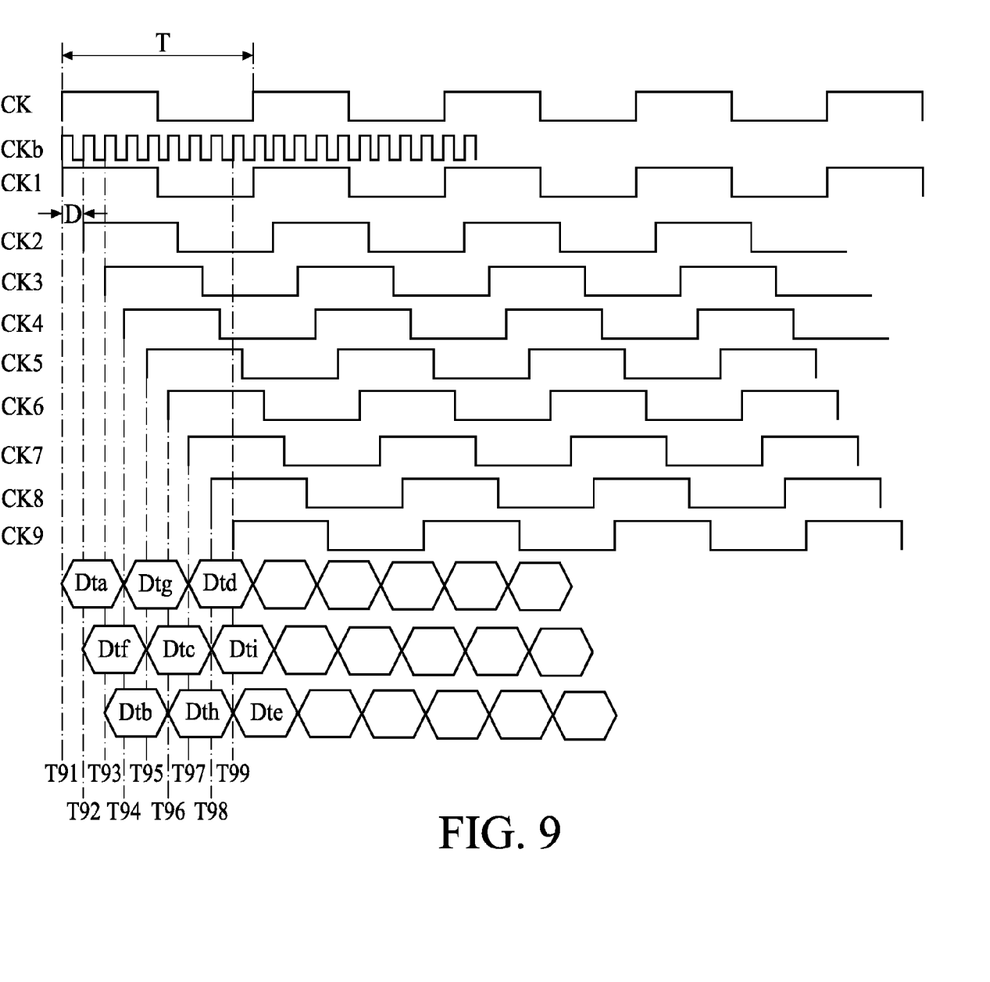
FIG. 9 is a timing diagram of clock signals in a toggling operation, in accordance with some embodiments.

FIG. 9 is a timing diagram of clock signals for toggling a mirror array in a toggling operation, in accordance with some embodiments. Referring to FIG. 9 and also to FIG. 7, the clock signal CK received at the boost unit 254 has a period of T. The frequency of the reference clock signal CKb, generated by the boost unit 254, is a multiple of the frequency of the clock signal CK. The first clock signal CK1, in phase with the clock signal CK, is provided at a rising edge of the reference clock signal CKb at a time point T91. Moreover, in response to a rising edge of the first clock signal CK1 at the time point T91, patterning data Dta associated with the first group of mirror cells 253a are provided. As a result, the first group of mirror cells 253a is toggled in response to the first clock signal CK1 at the time point T91. Furthermore, the first group of mirror cells 253a is disposed in a first half of the mirror array 153.

The second clock signal CK2, lagging behind the first clock signal CK1 by the time delay D, is provided at an immediately following rising edge of the reference clock signal CKb at a time point T92. Moreover, in response to a rising edge of the second clock signal CK2 at the time point T92, patterning data Dtf associated with the sixth group of mirror cells 253f are provided. As a result, the sixth group of mirror cells 253f is toggled in response to the second clock signal CK2 at the time point T92. Furthermore, the sixth group of mirror cells 253f is disposed in a second half of the mirror array 153.

The third clock signal CK3, lagging behind the second clock signal CK2 by the time delay D, is provided at an immediately following rising edge of the reference clock signal CKb at a time point T93. Moreover, in response to a rising edge of the third clock signal CK3 at the time point T93, patterning data Dtb associated with the second group of mirror cells 253b are provided. As a result, the second group of mirror cells 253b is toggled in response to the third clock signal CK3 at the time point T93. Furthermore, the second group of mirror cells 253b is disposed in the first half of the mirror array 153.

The fourth clock signal CK4, lagging behind the third clock signal CK3 by the time delay D, is provided at an immediately following rising edge of the reference clock signal CKb at a time point T94. Moreover, in response to a rising edge of the fourth clock signal CK4 at the time point T94, patterning data Dtg associated with the seventh group of mirror cells 253g are provided. As a result, the seventh group of mirror cells 253g is toggled in response to the fourth clock signal CK4 at the time point T94. Furthermore, the seventh group of mirror cells 253g is disposed in the second half of the mirror array 153.

The fifth clock signal CK5, lagging behind the fourth clock signal CK4 by the time delay D, is provided at an immediately following rising edge of the reference clock signal CKb at a time point T95. Moreover, in response to a rising edge of the fifth clock signal CK5 at the time point T95, patterning data Dtc associated with the third group of mirror cells 253c are provided. As a result, the third group of mirror cells 253c is toggled in response to the fifth clock signal CK5 at the time point T95. Furthermore, the third group of mirror cells 253c is disposed in the first half of the mirror array 153.

The sixth clock signal CK6, lagging behind the fifth clock signal CK5 by the time delay D, is provided at an immediately following rising edge of the reference clock signal CKb at a time point T96. Moreover, in response to a rising edge of the sixth clock signal CK6 at the time point T96, patterning data Dth associated with the eighth group of mirror cells 253h are provided. As a result, the eighth group of mirror cells 253h is toggled in response to the sixth clock signal CK6 at the time point T96. Furthermore, the eighth group of mirror cells 253h is disposed in the second half of the mirror array 153.

The seventh clock signal CK7, lagging behind the sixth clock signal CK6 by the time delay D, is provided at an immediately following rising edge of the reference clock signal CKb at a time point T97. Moreover, in response to a rising edge of the seventh clock signal CK7 at the time point T97, patterning data Dtd associated with the fourth group of mirror cells 253d are provided. As a result, the fourth group of mirror cells 253d is toggled in response to the seventh clock signal CK7 at the time point T97. Furthermore, the fourth group of mirror cells 253d is disposed in the first half of the mirror array 153.

The eighth clock signal CK8, lagging behind the seventh clock signal CK7 by the time delay D, is provided at an immediately following rising edge of the reference clock signal CKb at a time point T98. Moreover, in response to a rising edge of the eighth clock signal CK8 at the time point T98, patterning data Dti associated with the ninth group of mirror cells 253i are provided. As a result, the ninth group of mirror cells 253i is toggled in response to the eighth clock signal CK8 at the time point T98. Furthermore, the ninth group of mirror cells 253i is disposed in the second half of the mirror array 153.

The ninth clock signal CK9, lagging behind the eighth clock signal CK8 by the time delay D, is provided at an immediately following rising edge of the reference clock signal CKb at a time point T99. Moreover, in response to a rising edge of the ninth clock signal CK9 at the time point T99, patterning data Dte associated with the fifth group of mirror cells 253e are provided. As a result, the fifth group of mirror cells 253e is toggled in response to the ninth clock signal CK9 at the time point T99. Furthermore, the fifth group of mirror cells 253e is disposed in the first half of the mirror array 153.

In some embodiments, a method for operating a dynamic pattern generator (DPG) having a mirror array is provided. In accordance with the method, a clock signal is received, a time delay is determined based on the period of the clock signal, a first clock signal for toggling a first group of mirror cells in the mirror array is determined, and a second clock signal, lagging behind the first clock signal by the time delay, for toggling a second group of mirror cells in the mirror array is determined. Moreover, the first group of mirror cells in the mirror array is toggled in response to the first clock signal, and the second group of the mirror cells in the mirror array is toggled in response to the second clock signal.

In some embodiments, a method for operating a dynamic pattern generator (DPG) having a mirror array is provided. In accordance with the method, a clock signal is received, the number of groups of mirror cells for toggling in determined, a reference clock signal is provided based on the clock signal, the frequency of the reference clock signal being a multiple of the frequency of the clock signal, a time delay based on the period of the reference clock signal is determined, and the mirror cells are toggled one group after another at regular intervals of the time delay.

In some embodiments, a dynamic pattern generator (DPG) is provided. The DPG includes an array of mirror cells, a calculation unit configured to determine the number of groups of mirror cells to be toggled in a toggling operation, and a clock generation unit configured to provide toggling clock signals to the groups of mirror cells at different time points for toggling the groups of mirror cells one at a time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a dynamic pattern generator (DPG) having a mirror array, the method comprising:
   receiving a clock signal;
   determining a time delay based on the period of the clock signal;
   determining a first clock signal for toggling a first group of mirror cells in the mirror array;
   determining a second clock signal, lagging behind the first clock signal by the time delay, for toggling a second group of mirror cells in the mirror array;
   toggling the first group of mirror cells in the mirror array in response to the first clock signal; and
   toggling the second group of the mirror cells in the mirror array in response to the second clock signal.

2. The method according to claim 1 further comprising:
   receiving patterning data; and
   determining the number of groups of mirror cells in the mirror array for toggling in a toggling operation.

3. The method according to claim 2 further comprising:
   determining a third clock signal lagging behind the second clock signal by the time delay; and
   toggling a third group of the mirror cells in the mirror array in response to the third clock signal.

4. The method according to claim 1 further comprising:
   providing first patterning data associated with the first group of mirror cells in response to the first clock signal; and
   providing second patterning data associated with the second group of mirror cells in response to the second clock signal.

5. The method according to claim 1, wherein the first group of mirror cells is disposed in a first half of the mirror array, and the second group of mirror cells is disposed in a second half of the mirror array.

6. The method according to claim 1, wherein the first clock signal is in phase with the clock signal.

7. The method according to claim 1, after receiving the clock signal, further comprising:
   providing a reference clock signal, whose frequency is a multiple of the frequency of the clock signal.

8. The method according to claim 7, wherein determining a time delay based on the period of the clock signal includes determining the period of the reference clock signal as the time delay.

9. A method for operating a dynamic pattern generator (DPG) having a mirror array, the method comprising:
   receiving a clock signal;
   determining the number of groups of mirror cells for toggling;
   providing a reference clock signal based on the clock signal, the frequency of the reference clock signal being a multiple of the frequency of the clock signal;
   determining a time delay based on the period of the reference clock signal; and
   toggling one group of mirror cells after another at regular intervals of the time delay.

10. The method according to claim 9, wherein toggling one group of mirror cells after another includes:
    toggling a first group of mirror cells in response to a first clock signal; and
    toggling a second group of mirror cells in response to a second clock signal lagging behind the first clock signal by the time delay.

11. The method according to claim 10 further comprising:
    providing first patterning data associated with the first group of mirror cells in response to the first clock signal; and
    providing second patterning data associated with the second group of mirror cells in response to the second clock signal.

12. The method according to claim 10 wherein toggling one group of mirror cells after another includes:
    providing an N-th clock signal to toggle one of group of mirror cells in one half of the mirror array; and
    providing an (N+1)-th clock signal to toggle one of group of mirror cells in the other half of the mirror array, N being a natural number.

13. The method according to claim 10, wherein the first group of mirror cells is disposed in a first half of the mirror array, and the second group of mirror cells is disposed in a second half of the mirror array.

14. The method according to claim 9, wherein toggling one group of mirror cells after another includes:
    alternately toggling one of groups of mirror cells in one half of the mirror array and toggling one of groups of mirror cells in the other half of the mirror array.

15. A dynamic pattern generator (DPG), comprising:
    an array of mirror cells;
    a calculation unit configured to determine the number of groups of mirror cells to be toggled in a toggling operation; and
    a clock generation unit configured to provide toggling clock signals to the groups of mirror cells at different time points for toggling the groups of mirror cells one at a time.

16. The DPG according to claim 15 further comprising a memory to store patterning data for toggling the array of mirror cells, wherein the calculation unit is configured to determine the number of groups of mirror cells based on the patterning data.

17. The DPG according to claim 15, wherein the calculation unit is configured to determine a time delay, and the clock generation unit is configured to provide a first toggling clock signal to toggle a first group of mirror cells, and a second toggling clock signal to toggle a second group of mirror cells, the second toggling clock signal lagging the first toggling clock signal by the time delay.

18. The DPG according to claim 17, wherein the first group of mirror cells is disposed in one half of the array of mirror cells, and the second group of mirror cells is disposed in the other half of the array of mirror cells.

19. The DPG according to claim 17 further comprising:
a boost unit configured to provide a reference clock signal in response to a clock signal, the frequency of the reference clock signal is a multiple of the frequency of the clock signal.

20. The DPG according to claim 19, wherein the time delay is the period of the reference clock signal.

* * * * *